Sept. 6, 1966 D. I. POMERANTZ 3,271,201

PLANAR SEMICONDUCTOR DEVICES

Filed Oct. 30, 1962

INVENTOR.
DANIEL I. POMERANTZ
BY
Kenway, Jenney & Hildreth
ATTORNEYS

United States Patent Office 3,271,201

Patented Sept. 6, 1966

3,271,201
PLANAR SEMICONDUCTOR DEVICES

Daniel I. Pomerantz, Lexington, Mass., assignor, by mesne assignments, to International Telephone and Telegraph Corporation, New York, N.Y., a corporation of Maryland Filed Oct. 30, 1962, Ser. No. 234,108
2 Claims. (Cl. 148—33.3)

This invention relates in general to the manufacture of semiconductor devices and in particular to the making of electrical connections to such devices.

For various reasons there has been a continuing trend toward smaller and smaller semiconductor devices. With each reduction in size manufacturing problems have increased, and not the least of these problems is that of making electrical connections to the various operating elements of the device. Among the devices which are becoming increasingly important are so-called planar devices. Although, generally, there are both diodes and transistors in this class of device, the planar transistor poses the greater problem insofar as the making of electrical connections to its elements is concerned. First, the device is extremely small and quite fragile. The basic structure generally consists of a tiny die of semiconductor material, into several areas of which impurities are diffused to form junctions. These areas actually are operative elements of the device, and connections must be made to them to permit their incorporation into circuits.

Among the techniques for forming the areas, the most common is probably one in which a photoresist process is used. In carrying out this process, the die of semiconductor material is usually masked over much of its area. By diffusion or, in some cases, other techniques, the unmasked portion of the die is doped with an impurity to a predetermined depth. In this fashion, a junction is formed between the doped area and the remainder of the die. Following this operation, if a transistor is to be made, it is the practice to carry the masking over a portion of the area just doped as well as over the rest of the original die, and a second doping operation is then carried out. The second doping is usually done by diffusing into the material an impurity of a conductivity type opposite to that of the material used in the first doping operation.

The foregoing is a somewhat oversimplified explanation because it is fairly common to start with a die which might be of N-type material which might be termed the substrate. The substrate may then be masked to leave only a relatively small central area exposed. A P-type impurity is then diffused into the central area to form one element in the device. Finally, in the case of transistors, all but a tiny area roughly centered in the base areas is masked, and an N-type impurity is diffused into the tiny opening to form an emitter for the device.

Considering the fact that the original die may be of the order of .0004 square inch and that the transistor base formed may be of the order of .00001 square inch and that the transistor emitter is a dot no larger than .000002 square inch, it is obvious that the making of electrical connections to all but the substrate is a difficult proposition. Comparable dimensions exist for the elements of diodes.

Thermocompression bonding is often utilized to connect leads to the elemental areas, but a certain amount of breakage is inevitably encountered with the application of the pressure necessary to make the bond. Also, poor connections are often made principally because the size of wire that must be used as well as the size of the areas to which the wires are being attached are almost infinitesimal.

It has been suggested that metallized layers be applied or deposited over the masking insulating coating to obtain the desired electrical contact to the emitters and bases of transistors and to the working elements of diodes. This proposal is superficially quite attractive because of the existence of a masking oxide in many of the devices remaining from previous manufacturing steps described above. For example, there would be in many instances a coating or layer of silicon dioxide already available to receive the metallized layers. Portions of the silicon dioxide could be removed to permit contact to the various elements, and the metallic strips running over the oxide layers would be supported by the oxide which would add to their physical strength while insulating them from undesired contact with more than the desired element or elements.

Unfortunately, when this proposal was put into practice, the capacity between the body of the device and the metalized strips or layers which contact the elements frequently was sufficiently high that signals of commonly used higher frequencies were by-passed by the condensers which were thus created. Of course, the silicon dioxide coating could be made a great deal thicker to decrease the capacity of the condenser which is formed, but to do so would make the entire structure inconveniently thick.

It is an object of the present invention to avoid the stray capacitances associated with the use of metallized strips and layers as connecting leads to the elements of a semiconductor device.

It is another object of the present invention to simplify the manufacture of planar diodes and transistors.

It is still another object of the present invention to improve the efficiency, frequency range and speed of response of semiconductor devices.

A further object of the present invention is to permit the efficient use of photoresist techniques and to provide electrical connection to semiconductor elements by an extension of those techniques.

In general, the present invention consists in the provision of an auxiliary layer, preferably diffused, about the base of a planar transistor or about one of the elements of a diode. The layer may be made of intrinsic material, which is, of course, of very high resistivity. Alternatively, the layer which is provided may be of the same conductivity type as that of the base region of a transistor or the encircled element of a diode.

In the first alternative, the thickness of the dielectric between the condenser plates formed by the metallized connecting layers and the semiconductor body is effectively increased, resulting in lowered capacity. In the second alternative, the effect is to place a second smaller condenser in series with the large condenser formed by the metallized layer and the semiconductor body. The placement of these two condensers in series also results in a reduction of the total capacity. For a better understanding of the present invention, together with other and further objects, advantages and features, reference should be made to the following detailed description which should be read in conjunction with the appended drawings, in which:

Figure 1:
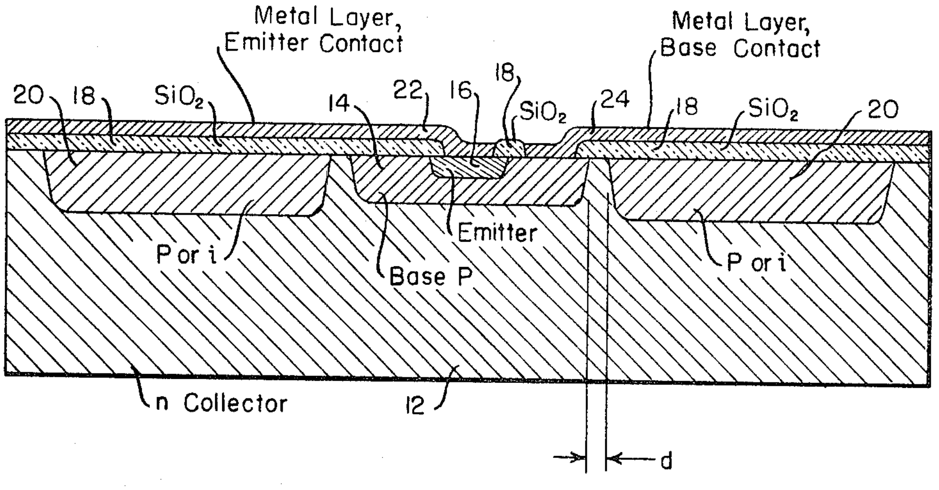
FIG. 1 is a cross-section taken through a planar transistor.

FIG. 1 illustrates a substantially completed device which is fabricated in either of two ways as is explained in greater detail hereinbelow. The basic element from which the device is formed is a die 12 of N-type semiconductor material designed to serve as the collector. The die may be circular or rectangular in shape, and roughly centered in the top surface of the die is a region 14 made up of P-type material which constitutes the base element of the transistor. Roughly centered in the P-type region, a smaller quantity of N-type material is disposed to form an emitter 16. Over much of the entire upper surface of the die is a masking layer 18 of insulating material. This layer may be that which remains from previous making operations used in forming the various regions which serve as the transistor elements.

In addition to the elements described above, the base region is surrounded by a layer of material 20 which is either intrinsic or P-type. This layer is in close proximity to the base 14 as indicated at "*d*," and its depth of penetration into the collector 12 may be approximately the same as that of the base 14.

A metallic layer 22 is disposed upon one portion of the masking layer 18 and is in contact with the emitter 16. A second metallic layer 24 is also deposited upon the masking layer 18 and is in contact with the base region 14. Both the metal layers 22 and 24 serve as contacts to permit electrical connection to the emitter and base, respectively.

In the situation where the layer 20 is of intrinsic material, it is obvious that the thickness of dielectric material between the metallized layer 22 or 24 is extended. The resistivity of the intrinsic material is so high that it is to all intents and purposes an insulator serving as dielectric material in addition to the masking layer between the N-type material of the die and the metal of the layers 22 and 24 which contact the emitter and base, respectively.

In the alternative situation, where the regions 20 are of P-type material, the regions are sufficiently thin and of such shallow grading that a very small condenser is formed with the collector 12 as one plate and the high P-type area 20 as the other plate. In the first case, by the expedient of effectively spreading the condenser plates further apart by adding dielectric material, capacity is lowered. In the second case, by adding a very small capacity in series with that of the major condenser, the total capacity is again lowered.

In either case, it is desirable that the spacing between the base region and the added layers of intrinsic or P-type material be held to the lowest possible value. A degree of tolerance is permissible in this parameter, but in general, the closer the spacing between the two, the more effective the operation of the invention becomes.

As was mentioned above, the device of the present invention may be fabricated in at least two ways. In the situation where the layer 20 is to be of P-type material, the entire upper surface of the die 12 is covered with a masking material. If a photoresist technique is utilized, the masking material on the upper surface of the die may be exposed to light to harden the material in all areas except those where it is desired to form a base region 14 and the region 20. Upon development, the unexposed areas of the masking material are washed away, and a P-type doping material may be diffused into the surfaces of the die which are not covered.

Following this operation, the entire area of the upper surface of the die may be masked again, and only the masking material above a central portion in the base region is removed. An N-type doping agent is then diffused into the exposed region to form the emitter 16. Additional masking material may be applied roughly centrally of the die to maintain insulation between the emitter 16 and any portion of the base 14. At this point, any suitable metallic material may be evaporated upon the upper surface of the masking layer. Aluminum has proven to be an excellent material for this operation.

The alternative technique of fabrication follows much the same procedure outlined above. However, in order to form a layer 20 of intrinsic material, it is necessary to diffuse an intrinsifying agent such as gold into the die as one of the preliminary operations. This layer 20 may then be masked, and the operations described above may then be carried out in much the same order.

In the case where the die or substrate consists of silicon, the masking material may conveniently be silicon dioxide. It has been noted that gold may be used where it is desired to form intrinsic layers 20, and many doping agents are suitable to form the P-type layers. Among the suitable doping agents to render the semiconductor material P-type is gallium.

Figure 2:
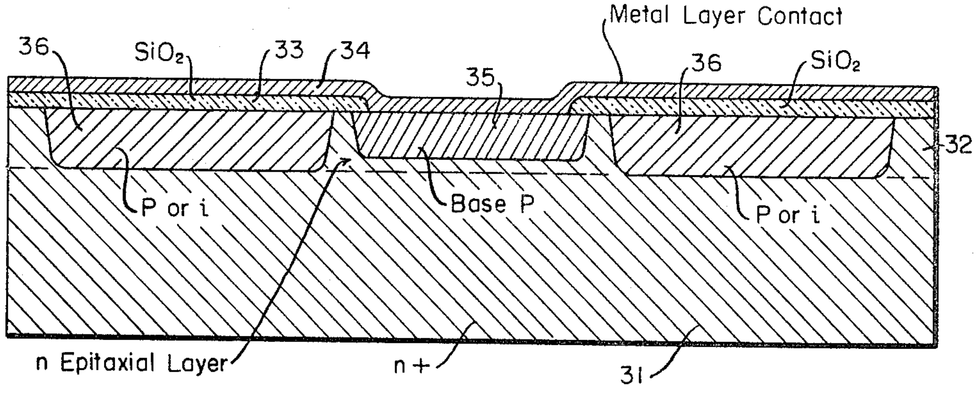
FIG. 2 is a similar cross-section taken through a planar diode.

In FIG. 2 the application of the present invention to a specific diode of planar configuration is illustrated. Here, however, there is shown a planar epitaxial diode in which a substrate 31, preferably of $N^+$-type material, is first covered by an epitaxial layer 32 of N-type material. This layer 32 may be obtained by gas deposit or other suitable method. Over the layer of epitaxial material is a masking layer 33 which may conveniently be formed of silicon dioxide, and over that layer is a metallic contact layer 34.

Within the epitaxial layer 32 are formed a diode element 35 and an auxiliary element or layer 36, closely spaced from and surrounding the element 35. The auxiliary layer 36, in a manner entirely similar to the layer 20 of FIG. 1, acts as a capacity-reducing factor. Again, as with the layer 20 of FIG. 1, the layer 36 may be of P-type material or of intrinsic material, its function is similar to that of the layer 20, and it may be formed in the same manner as the layer 20.

The invention has been described with reference to two specific embodiments for purposes of exposition only. It is obvious that semiconductor materials other than silicon may be used with minor modifications such as changes of masking material or the like. It is also plain that the substrate need not be of N or $N^+$-type material, because suitable reversals of conductivity type for a P-type substrate and other elements of the devices are easily worked out by those skilled in the art. These and similar variations are believed to be within the purview of the present invention which should be limited only by the spirit and scope of the appended claims.

What is claimed is:

1. A planar diode comprising:

a die of semiconductor material having a first region of one conductivity type, at least a portion of said region being contiguous with a given surface of said die;

a second region of opposite conductivity type inset into said first region, the surface of said second region being contiguous with said given surface;

a layer of insulating material on said given surface having an aperture therein to expose a given part of said second region;

a metallic layer on said layer of insulating material overlying the contiguous portion of said first region and contacting said second region through said aperture; and an auxiliary region of said opposite conductivity type inset into and surrounded by said first region, the surface of said auxiliary region being contiguous with said given surface and underlying said metallic layer thereby to reduce the capacitance between said metallic layer and said first region.

2. A planar transistor comprising:

a die of semiconductor material having a collector region of one conductivity type, at least a portion of said collector region being contiguous with a given surface of said die;

a base region of opposite conductivity type inset into said collector region, the surface of said base region being contiguous with said given surface;

an emitter region of said one conductivity type inset into said base region, the surface of said emitter region being contiguous with said given surface;

a layer of insulating material on said given surface having apertures therein to expose given parts of said base and emitter regions;

a metallic layer on said layer of insulating material overlying the contiguous portion of said collector region and contacting a given one of said emitter and base regions through a corresponding one of said apertures; and an auxiliary region of said opposite conductivity type inset into and surrounded by said collector region, the surface of said auxiliary region being contiguous with said given surface and underlying said metallic layer thereby to reduce the capacitance between said metallic layer and said collector region.

References Cited by the Examiner

UNITED STATES PATENTS

| | | | |
|---|---|---|---|
| 2,672,528 | 3/1954 | Shockley | 148—33 XR |
| 2,858,489 | 10/1958 | Henkels | 148—33.3 XR |
| 2,953,488 | 9/1960 | Shockley | 148—33.5 |
| 2,981,877 | 4/1961 | Noyce | 148—33.3 XR |
| 2,983,631 | 5/1961 | Hanlet | 148—174 X |
| 3,005,937 | 10/1961 | Wallmark et al. | 148—33.2 XR |
| 3,006,791 | 10/1961 | Webster | 148—33.5 |
| 3,007,091 | 10/1961 | Fuller | 148—33.5 XR |
| 3,028,529 | 4/1962 | Belmont et al. | 148—33.5 XR |
| 3,064,167 | 11/1962 | Hoerni | 148—33.5 XR |
| 3,094,650 | 6/1963 | Riegert | 317—235 XR |
| 3,183,129 | 5/1965 | Tripp | 148—33 XR |

OTHER REFERENCES

IBM Technical Disclosure Bulletin, vol. 4, No. 10, March, 1962, pages 58, 59.

DAVID L. RECK, *Primary Examiner.*

D. L. REISDORF, C. N. LOVELL, *Assistant Examiners.*